(12) United States Patent
Parker

(10) Patent No.: US 7,190,157 B2
(45) Date of Patent: Mar. 13, 2007

(54) METHOD AND APPARATUS FOR LAYOUT INDEPENDENT TEST POINT PLACEMENT ON A PRINTED CIRCUIT BOARD

(75) Inventor: Kenneth P. Parker, Fort Collins, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 10/972,822

(22) Filed: Oct. 25, 2004

(65) Prior Publication Data

US 2006/0087337 A1    Apr. 27, 2006

(51) Int. Cl.
*G01R 31/28*   (2006.01)
*G01R 31/26*   (2006.01)

(52) U.S. Cl. .................... 324/158.1; 324/765
(58) Field of Classification Search ............... None
See application file for complete search history.

(56) References Cited

U.S. PATENT DOCUMENTS

| | | | | |
|---|---|---|---|---|
| 4,413,309 A * | 11/1983 | Takahashi et al. | ........... | 361/774 |
| 4,764,644 A * | 8/1988 | Reisman et al. | ............ | 174/253 |
| 4,766,268 A * | 8/1988 | Uggowitzer | ................ | 174/256 |
| 5,048,747 A * | 9/1991 | Clark et al. | ............ | 228/180.21 |
| 5,171,716 A * | 12/1992 | Cagan et al. | ................ | 438/113 |
| 5,252,781 A * | 10/1993 | Shirai et al. | ................. | 174/261 |
| 5,260,518 A * | 11/1993 | Tanaka et al. | ............... | 174/261 |
| 5,317,801 A * | 6/1994 | Tanaka et al. | ................ | 29/830 |
| 5,357,060 A * | 10/1994 | Yamashita | ................... | 174/267 |
| 5,517,756 A * | 5/1996 | Shirai et al. | .................. | 29/847 |
| 5,523,920 A * | 6/1996 | Machuga et al. | ........... | 361/767 |
| 5,559,372 A * | 9/1996 | Kwon | ........................ | 257/692 |
| 5,864,946 A * | 2/1999 | Eldridge et al. | .............. | 29/843 |
| 6,002,172 A * | 12/1999 | Desai et al. | ................ | 257/737 |
| 6,047,637 A * | 4/2000 | Chan et al. | .................. | 101/129 |
| 6,169,253 B1 * | 1/2001 | Jairazbhoy et al. | ......... | 174/250 |
| 6,229,711 B1 * | 5/2001 | Yoneda | ....................... | 361/760 |
| 6,243,655 B1 * | 6/2001 | Caggiano et al. | ........... | 702/117 |
| 6,284,563 B1 * | 9/2001 | Fjelstad | ........................ | 438/106 |
| 6,291,778 B1 * | 9/2001 | Asai et al. | ................... | 174/263 |
| 6,303,880 B1 * | 10/2001 | Asai et al. | ................... | 174/263 |
| 6,337,445 B1 * | 1/2002 | Abbott et al. | ............... | 174/260 |
| 6,407,669 B1 * | 6/2002 | Brown et al. | ............. | 340/572.1 |
| 6,475,833 B2 * | 11/2002 | Lin | ............................. | 438/121 |
| 6,528,891 B2 * | 3/2003 | Lin | ............................. | 257/778 |
| 6,740,577 B2 * | 5/2004 | Jin et al. | ..................... | 438/612 |
| 6,762,503 B2 * | 7/2004 | Lee | ............................. | 257/781 |
| 6,917,525 B2 * | 7/2005 | Mok et al. | ................... | 361/767 |
| 6,940,177 B2 * | 9/2005 | Dent et al. | .................. | 257/779 |
| 6,975,035 B2 * | 12/2005 | Lee | ............................. | 257/778 |
| 2005/0061540 A1 * | 3/2005 | Parker et al. | ............... | 174/250 |

* cited by examiner

*Primary Examiner*—Paresh Patel

(57) ABSTRACT

A layout independent test access point structure for accessing test points of a printed circuit board and method of fabrication thereof is presented. Each test access point structure is conductively connected to various locations along a trace at a test access point and above an exposed surface of the printed circuit board to be accessible for probing by a fixture probe.

10 Claims, 12 Drawing Sheets

METHOD AND APPARATUS FOR LAYOUT INDEPENDENT TEST POINT PLACEMENT ON A PRINTED CIRCUIT BOARD

REFERENCE TO RELATED PATENT DOCUMENTS

The subject matter of this patent application is related to that of U.S. patent application Ser. No. 10/670,649 entitled Printed Circuit Board Test Access Point Structures And Methods For Making The Same filed Sep. 24, 2003 by Kenneth P. Parker, Ronald J. Peiffer and Glen E. Leinbach and assigned to Agilent Technologies, Inc., which teaches the basic concepts of bead probes or test access point structures on a printed circuit board and is hereby incorporated herein by reference.

BACKGROUND OF THE INVENTION

Printed circuit assemblies (PCA's) are typically tested after manufacture to verify the continuity of traces between pads and vias on the board and to verify that components loaded on the PCA perform within specifications. Such printed circuit assembly testing is generally performed with automated in-circuit testers or ICT's and requires complex tester resources. The tester hardware must generally be capable of probing conductive pads, vias and traces on the board under test.

In-circuit testers (ICT) have traditionally used "bed-of-nails" (BON) access to gain electrical connectivity to circuit wiring (traces, nets, pads) for control and observation capability needed for testing. This necessitates having access points within the layout of circuit nets that can be targets for ICT probes. Test access points are usually circular targets with 28 to 35 mil diameter that are connected to traces on the printed circuit board. In some cases these targets are deliberately added test pads, and in other cases the targets are "via" pads surrounding vias already provided in the printed circuit.

Lower diameter targets are increasingly difficult to hit reliably and repeatably, especially when a test fixture may contain several thousand such probes. It is always desirable to use larger diameter targets, but this is in fundamental conflict with the industry trend towards higher densities and smaller geometry devices.

Yet another industry trend is to use higher and higher speed logic families. One Megahertz (MHz) designs became ten MHz designs, then 100 MHz designs, and are now reaching the Gigahertz domain. The increases in logic speed necessitate industry attention to board layout rules for higher-speed interconnects. The goal of these rules is to create a controlled impedance pathway that minimizes noise, crosstalk and signal reflections. Printed circuit boards traces that carry high-speed signals tend to have critical layout requirements and require controlled characteristic impedances. When traditional test probe targets are added, this causes discontinuities in the controlled impedances and may damage signal fidelity.

The preferred way of transmitting high-speed data is through differential transmission signals. FIG. 1 illustrates a classic pair of differential transmission signal traces 102a, 102b on a portion of a printed circuit board 100. As illustrated, the printed circuit board 100 is formed as a plurality of layers. In the illustrative embodiment, the printed circuit board 100 includes a ground plane 104 layered over a substrate 105, a dielectric 103 layered over the ground plane 104, traces 102a, 102b layered over the dielectric 103, and a solder mask 106 layered over the traces 102a, 102b and exposed surfaces of the dielectric 103. In such a layout, there are a number of critical parameters that affect the impedance of the signal path. These parameters include trace width 110, trace separation 111, trace thickness 112, and dielectric constants of the solder mask and board material. These parameters influence the inductance, capacitance, and resistance (skin effect and DC) of the traces, which combine to determine the transmission impedance. It is generally desireable to control this value across the entire run of each trace 102a, 102b.

In some higher speed designs it is also important to control the symmetry of the traces. FIG. 2A illustrates an ideal dense circuit layout with trces 102a–102f having identical lengths and 50 mils apart before any test targets have been added to the layout. However, routing signals on a crowded printed circuit board necessitates curves and bends in the path, which makes matching lengths and symmetries more difficult. In some cases, series components (such as series terminations or DC blocking capacitors) may be included in the path, and these have dimensions that differ from the layout parameters. Signals may also have to traverse connectors, which add to the difficulties.

Another trend is toward higher and higher density boards, which are also layout critical. When traditional test probe targets are added to a high-density board, the board layout is generally disturbed, as shown in FIGS. 2B and 2C in which adding two test probe targets to 2 nodes necessitates moving at least 4 others out of the way. Such changes to high-density boards in many cases, may not be practical, as there may not be any room to move traces. If any of the signal traces also happen to be high-frequency signal traces, then the bends needed to re-route them may also have a negative performance impact as well as the negative effects of the conventional target itself.

Additional difficulties arise when testing is considered. Testing requires tester access to circuit traces at particular probe targets. Layout rules typically require test targets to be at least 50 mils apart and may require the diameter of the test point targets to greatly exceed the width of the traces. FIG. 2B illustrates test targets 115a, 115b symmetrically positioned 50 mils apart on the differential signal traces 102a, 102b. FIG. 2C illustrates test targets 115a, 115b arranged asymmetrically, but at least 50 mils apart, on the differential signal traces 102a, 102b.

The positioning of test targets 115a, 115b can be problematic. In many cases the need to keep a minimum separation between targets (typically 50 mils, minimum) is in direct conflict with controlled impedance layout rules. These conflicts lead to either a compromise in controlled impedance integrity, or a forced reduction in target placement with a resulting reduction in testability.

While high-speed printed circuit boards are one example of layout-critical circuits, another more general case is that of high-density boards. Adding conventional probe targets to a high-density board will most likely disturb the layout as seen in FIGS. 2B–2C. In FIGS. 2B–2C, adding test points to just 2 nodes necessitates moving 4 other traces out of the way. In many cases, in a high-density circuit design, this may be impractical, if not impossible, as there may not be any room to move these 6 traces in a crowded circuit layout. If any traces are also high-frequency signal traces, then the re-routing may have an additional negative performance impact as well as the negative effects to the optimal circuit layout itself.

As signal speeds continue to rise and board densities increase, this problem will only get worse.

SUMMARY OF THE INVENTION

The present invention solves the conflict problems faced by traditional techniques for test access point placement on printed circuit boards by minimizing the perturbations of traces in the x- and y-dimensions and taking advantage of the z-dimension. In particular, the invention utilizes trace thickness to implement test access points, thereby allowing test access point placement almost anywhere along the trace. This in turn allows the ability to design printed circuit boards with test access point placement according to the positions of fixture probes of a given test fixture, rather than vice versa as in the prior art. The present invention permits printed circuit boards to be designed without consideration for where test points will be placed along the traces of the board, which will improve the performance of the board and permit denser circuitry on the board.

In one embodiment solder beads may be conductively connected to the top surfaces of traces where test access points are desired. In this embodiment, after the traces are printed or otherwise deposited on the printed circuit board, a solder mask having holes where test access points are desired may be deposited over the exposed surfaces of the traces. A solder stencil with a hole larger than the solder mask hole may be layered over the solder mask hole, exposing test access points along the traces. The solder stencil and solder mask may then be covered with solder paste, filling any holes in the stencil and mask. The solder paste may be made up of solder and flux. The solder stencil is removed, leaving islands of solder paste in selected places on the board. The solder paste may then be heated to burn off the flux, causing the solder to melt and retract and form solder beads that project above the walls of their respective solder mask holes. The dimensions of the solder mask and stencil mask holes determine the final diameter of the solder beads. Accordingly, test access point structures may be implemented directly along the trace, yet have a large enough diameter to be probed and still meet board layout requirements without interfering with the lay-out of the board.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION

Turning now in detail to the invention, on a trace defined in an x-, y-, z-coordinate system where the x-dimension represents the trace width, the y-dimension represents the trace length, and the z-dimension represents the trace thickness, it will be recognized by those skilled in the art that present techniques for test access point placement on a printed circuit board utilize only the x- and y-dimensions.

The present invention takes a different approach by taking advantage of the z-dimension, that is, the trace thickness. In this regard, the test access point structure of the invention is a localized "high point" on a printed circuit board trace that does not significantly perturb the impedance of the trace and that can be targeted with a probe. Throughout this specification, test access point structure and bead probe structure are used interchangeably.

Figure 3:
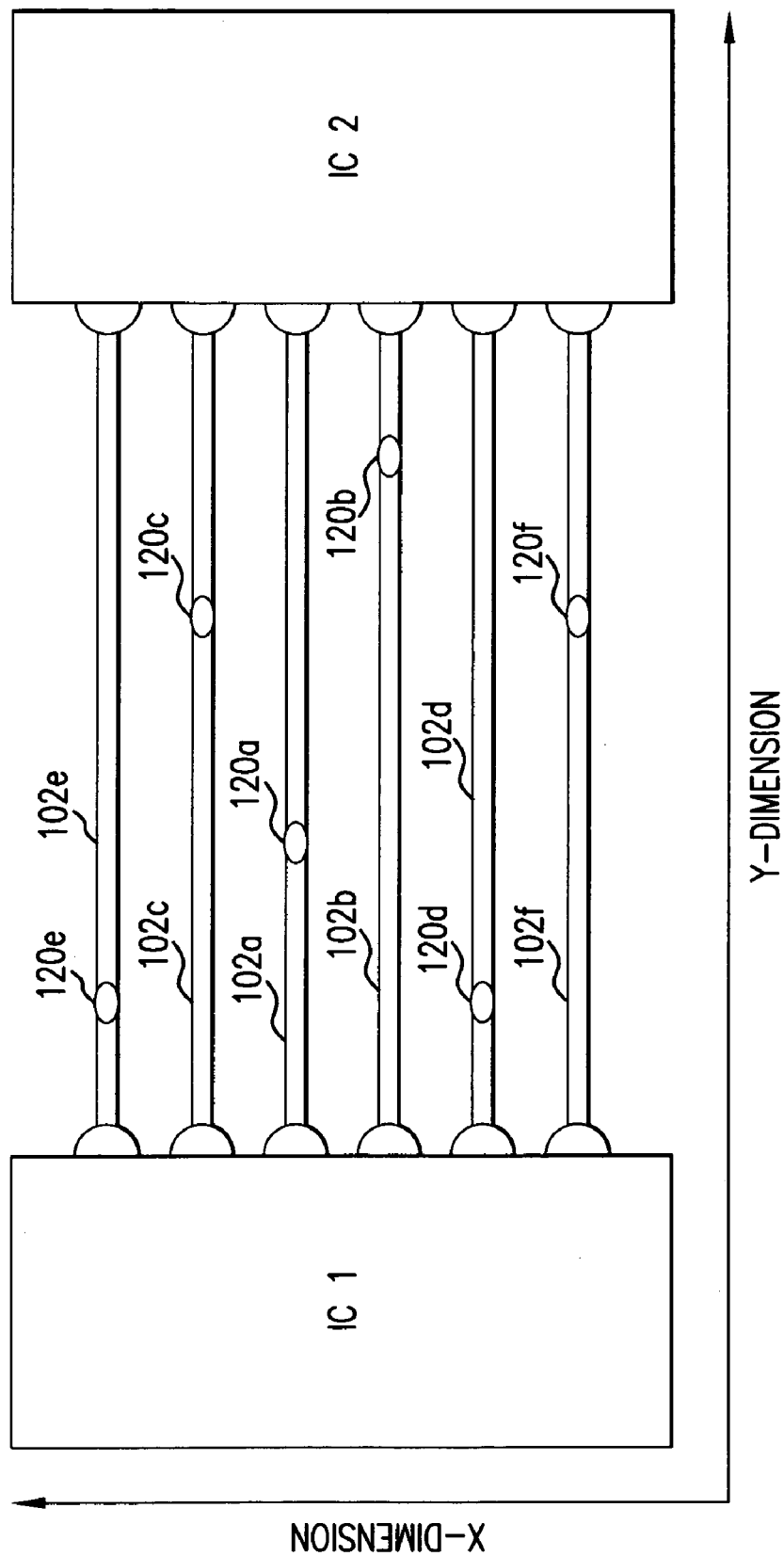
FIG. 3 is a top view of a portion of a printed circuit board showing the x- and y- dimensions in the x-, y-, z-coordinate system of six traces with test access point structures implemented in accordance with the principles of the invention.

FIG. 3 illustrates an exemplary embodiment of a test access point structure implemented in accordance with the invention. As shown in FIG. 3, test access point structures $120a$–$120f$ are conductively attached to the traces $102a$–$102f$ at predetermined test access points. The test access point structures $120a$–$120f$ project above the exposed surrounding surfaces of the solder mask to form an exposed localized high point on the traces $102a$–$102f$ that may be used as test targets by fixture probes during testing of the printed circuit board. In one embodiment, the test access point structures $120a$–$120f$ are solder beads with a length (in the y-dimension) larger than the width (in the x-dimension) of the trace to provide maximum probe access success.

In one exemplary method of manufacture of the test access point structures $120a$–$120f$, the invention may utilize existing printed circuit board fabrication processes, thereby keeping costs low. As known in the art, virtually every printed circuit board is constructed with high-speed signals appearing on the outer layers due to the ability to more easily control impedances on the outer layers. Test access point structures may also be added to densely packed traces on printed circuit board outer layers without requiring that they be recovered, since the test access point structures only perturb the traces in the z dimension. The two outer layers are typically coated with a solder mask that is used to assure that only exposed copper (or other conductive materials) areas will retain solder paste that is applied via a screen printing process. Holes in the solder mask assure that only those areas of copper that should be soldered will receive solder paste.

There may be a requirement that two test access points or bead probes $120a$–$120f$ not be too close to each other or to a device mounted on a printed circuit board, in order to ensure that that two or more fixture test probes targeting the test access point structures $120a$–$120f$ do not touch each other, or a nearby component during testing. There may also be a requirement that test access point structures $120a$–$120f$ not be located on segments of traces that pass underneath other components, as these components may shield that segment of the trace from access by test access point structures $120a$–$120f$. However, other segments of the same trace that are accessible may have test access point structures $120a$-$120f$ located thereon.

Figure 1:
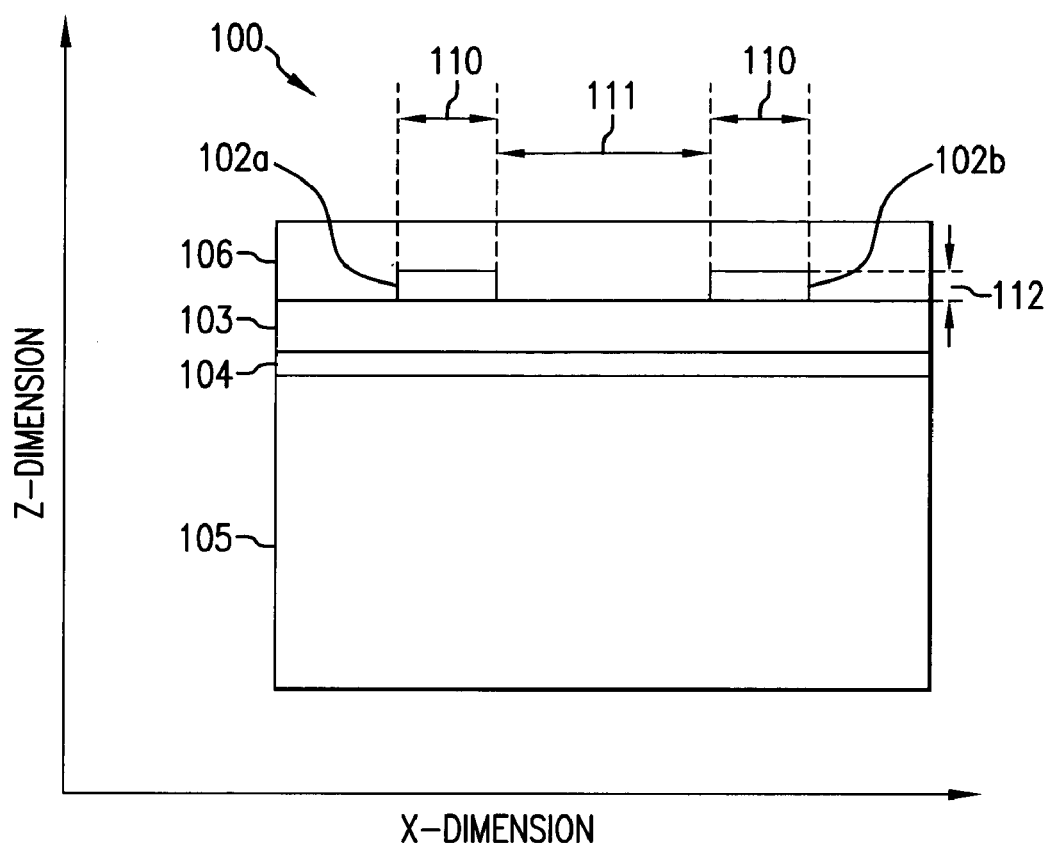
FIG. 1 is a cross-sectional side view of a conventional printed circuit board with differential signal traces showing the x- and z-dimensions in the x-, y-, z-coordinate system.
Figure 2A:
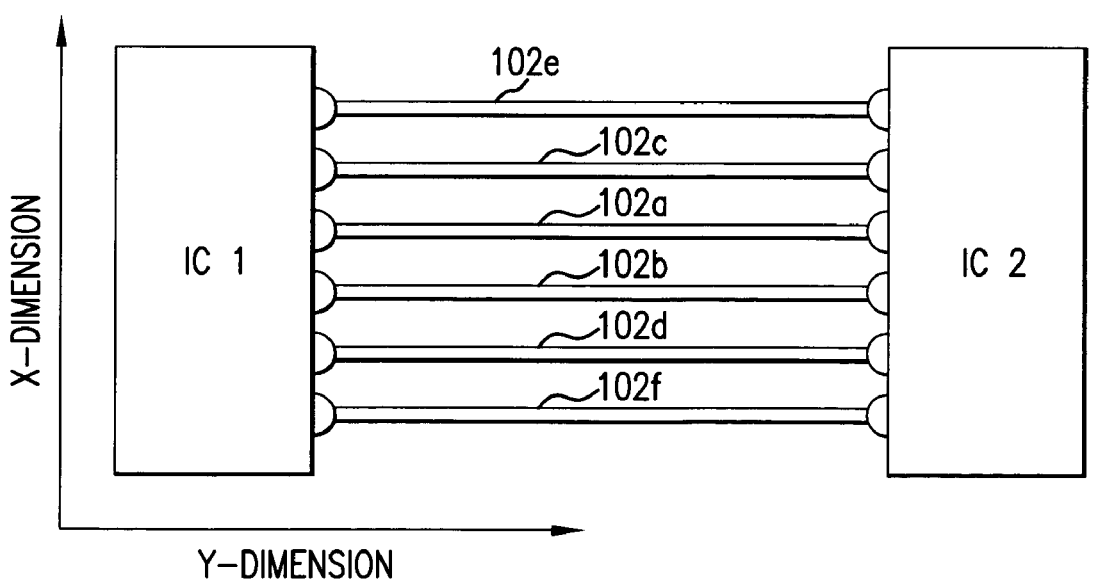
FIG. 2A is a top view of the printed circuit board of FIG. 1 showing the x- and y-dimensions of the differential signal traces in the x-, y-, z-coordinate system.
Figure 2B:
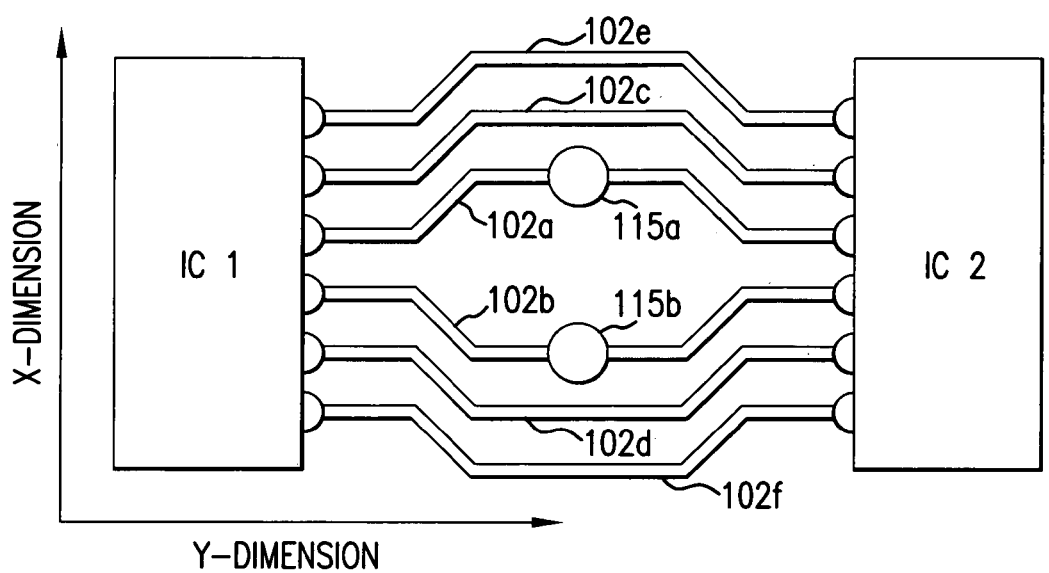
FIG. 2B is a top view of a printed circuit board showing the x- and y-dimensions in the x-, y-, z-coordinate system of six differential signal traces with symmetrically arranged test access point pads.
Figure 2C:
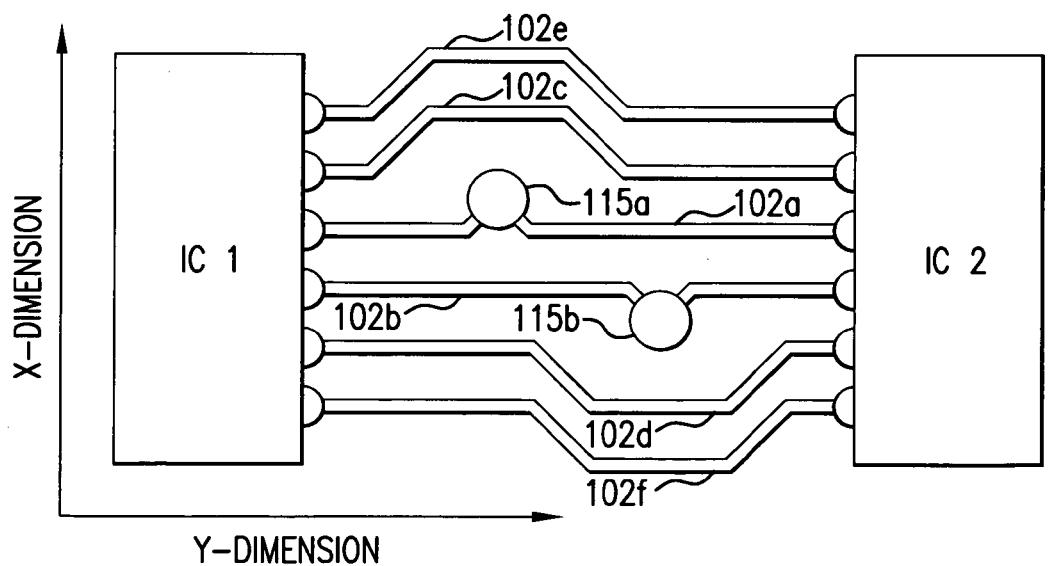
FIG. 2C is a top view of a printed circuit board showing the x- and y-dimensions in the x-, y-, z-coordinate system of six differential signal traces with asymmetrically arranged test access point pads.

Given the above potential restrictions on test access point structure placement, it is possible to perform layout independent positioning of test access point structures $120a$–$120f$. This means that a circuit designer may optimize a circuit layout for density and high-speed signal fidelity and later, a test engineer may add test access point structures $120a$–$120f$ without any re-routing of circuit traces. This may enhance the design/test relationship between circuit designers and test engineers, which is generally a tense relationship of tradeoffs between circuit performance, layout optimization and test optimization. With conventional test probe targets, as shown in FIGS. 2B and 2C, the test engineer had to negotiate with a designer to balance the need for test access against the risk the targets would perturb the design in an unacceptable way. If the designer refuses to implement the targets in certain places, reduced test coverage typically has resulted. If the designer puts in test targets, the circuit may no longer work properly, or its size may have to increase to fit them in.

Layout independence is also important to implement test access point placement. Essentially, for a given node, any point on it that is sufficiently removed from any other test access point location and also from any other device may be assigned a test access point. Indeed, several sites on each node may be selected as potential test access point locations so that later, an optimization algorithm may be employed to judge which location is best. The choices may be made based on a desire to minimize board flexure under probing force, cost (tightly spaced test access points may be smaller which may be more expensive and difficult to work with); or a desire to anticipate design changes that may force a different set of test access point location assignments.

Figure 4:
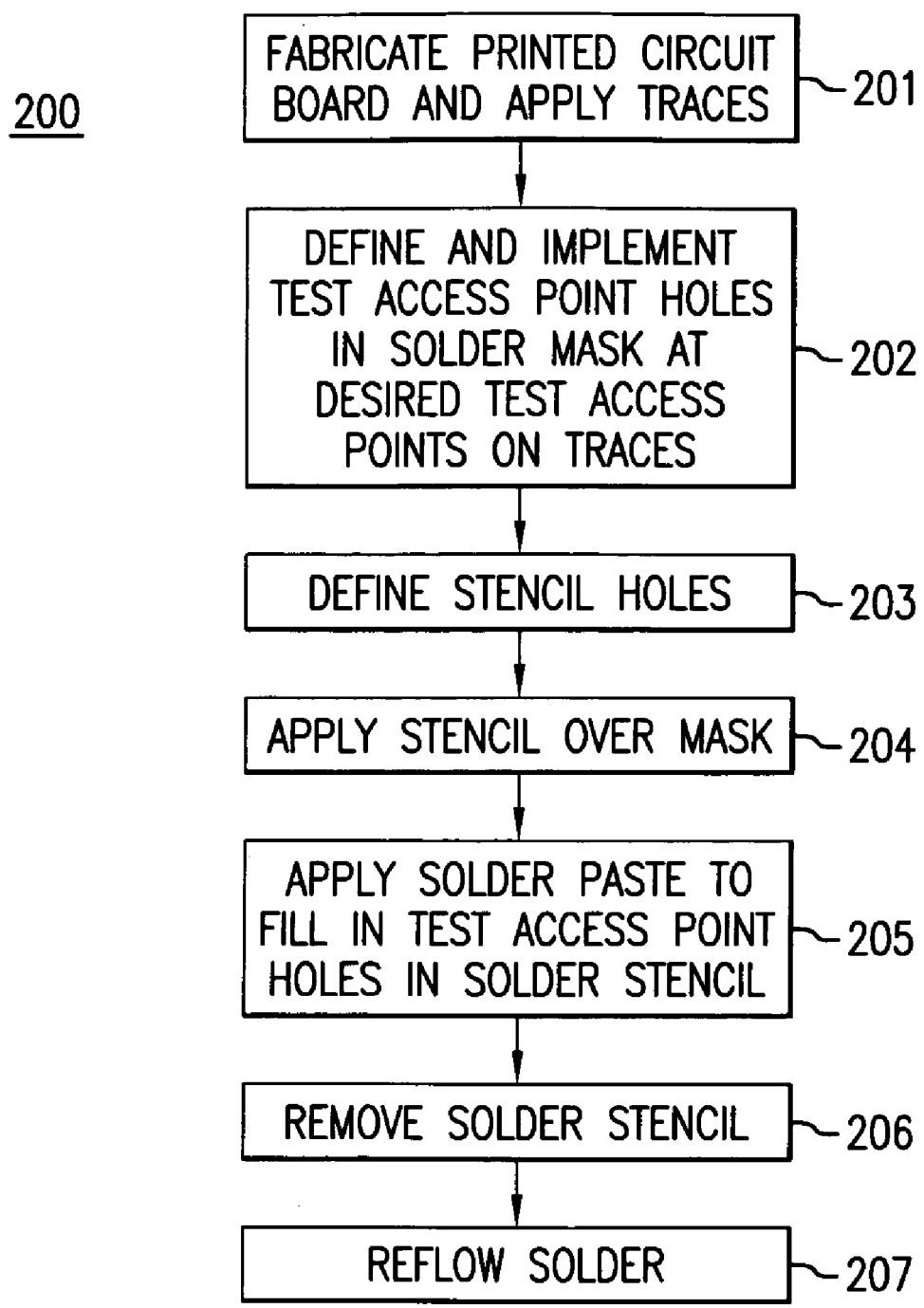
FIG. 4 is an operational flowchart illustrating a preferred method of manufacture of a test access point structure of the invention on a trace of a printed circuit board.

FIG. 4 is an operational flowchart illustrating a preferred method 200 of manufacture of a test access point structure on a trace of a printed circuit board, and FIGS. 5A–5G include various views of a portion of a printed circuit board 10 during manufacture of the test access point structure $18a$, $18b$ in accordance with the method of FIG. 4. Referring now to FIG. 4 with additional reference to FIGS. 5A–5G, FIGS. 6A–6C and FIGS. 7A–7B, in the preferred method of manufacture of the test access point structures of the invention, the printed circuit board 10 is fabricated in step 201 to the point of printing, depositing, or otherwise layering the traces $12a$, $12b$ on which test access point structures $18a$, $18b$ are to be implemented. In step 202, obround test access point holes $17a$, $17b$ (in addition to holes $19a$, $19b$, $19c$, $19d$ for the traditional points of solder—e.g., component pin-to-trace solder points) are defined and implemented in the printed circuit board solder mask 16 in locations over traces $12a$, $12b$ at desired test access points, as illustrated in FIGS. 5A–5C and 6A.

The positions of the obround test access point holes $17a$, $17b$ in the solder mask 16 are governed by rules on minimum probe spacing and proximity to other devices that must be avoided by fixture probes probing the test access point structures. The distance between test access points is largely determined by the size of the fixture probe used to contact the various test access points on the printed circuit board.

Figure 7A:
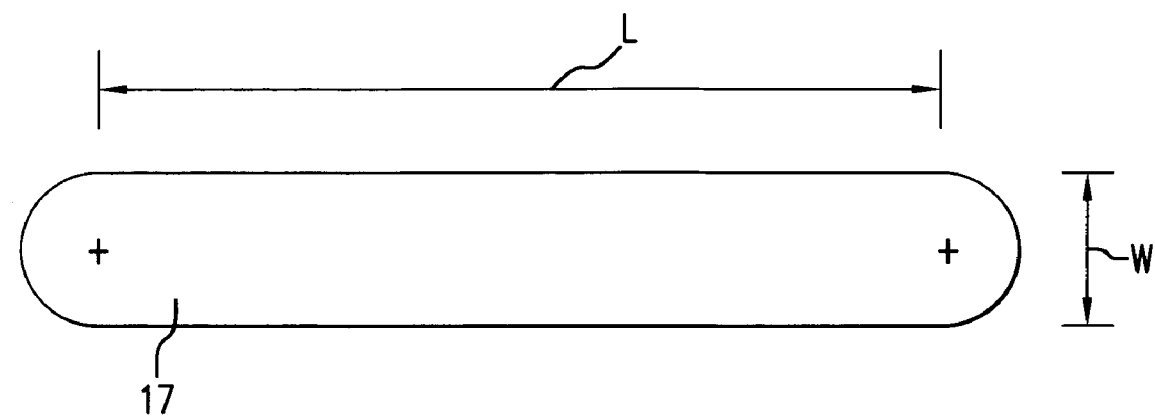
FIG. 7A is a top view showing the obround hole in the solder mask of FIGS. 6A–6C.

As discussed above, in step 202, obround (a rectangle with rounded ends) hole(s) 17 are formed (by means of standard photo-optical processing) in solder mask 16 over the trace 12 on the printed circuit board (not shown). The obround hole 17 may have a width W and length L, where L is measured from the center of the two circular ends, as shown in FIG. 7A. The obround hole 17 may have a total length of L+W and should be substantially the same width or narrower as the trace 12 directly underneath it. The length of the obround hole may preferably run along the trace.

Figure 7B:
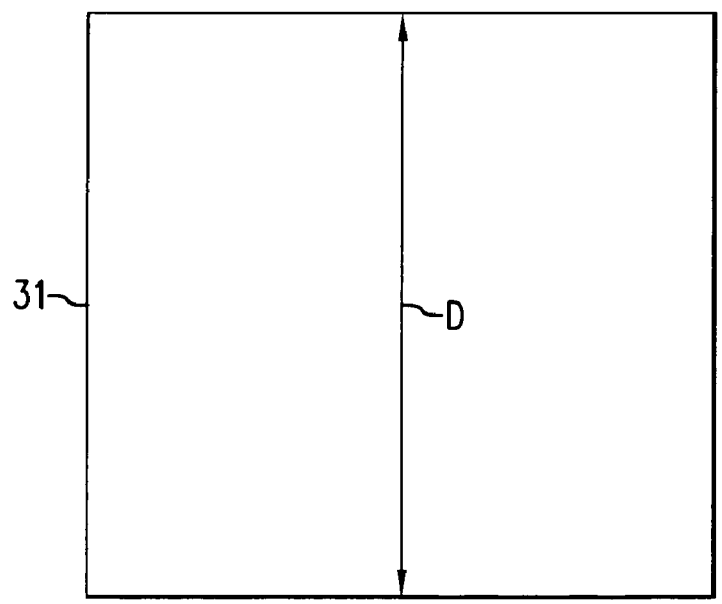
FIG. 7B is a top view showing the square hole in the solder stencil hole of FIGS. 6B–6C.

In step 203, substantially square holes 31 are defined in a solder stencil 30 (shown in FIG. 6B) by means of standard photo-optical etching or laser drilling process. A side of the square hole 31 may have a length D, as shown in FIG. 7B. In step 204 the solder stencil 30 is applied over the mask 16 (shown in FIG. 6C), such that the holes in the solder stencil 30 are aligned over the test access point holes $17a$, $17b$ in the solder mask 16 along a diagonal in the solder stencil 30. While other configurations and alignments are possible, this layout maximizes the amount of solder paste that will end up being in direct contact with the signal trace 12.

Figure 5A:
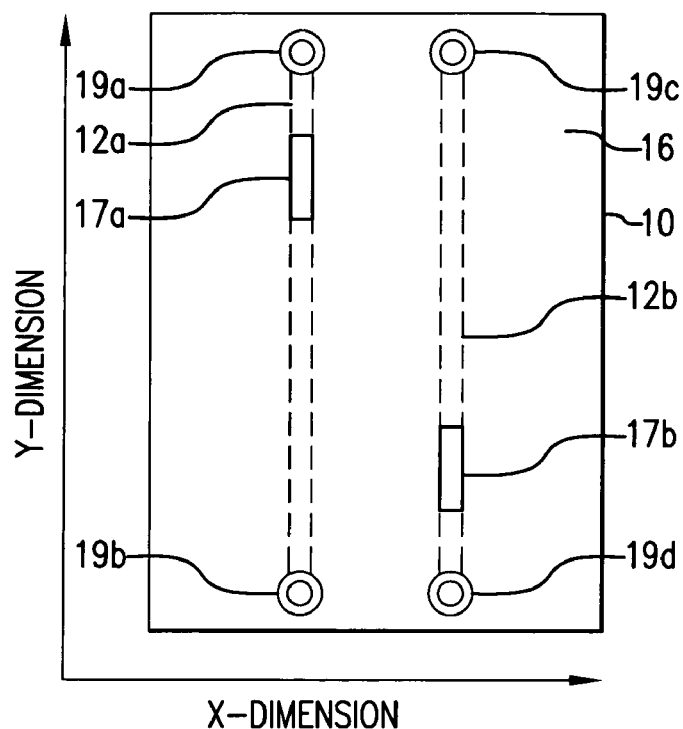
FIG. 5A is a top view of a portion of a printed circuit board showing the x- and y-dimensions in the x-, y-, z-coordinate system of a pair of differential traces with test access point structures implemented according to the method of FIG. 4.
Figure 5B:
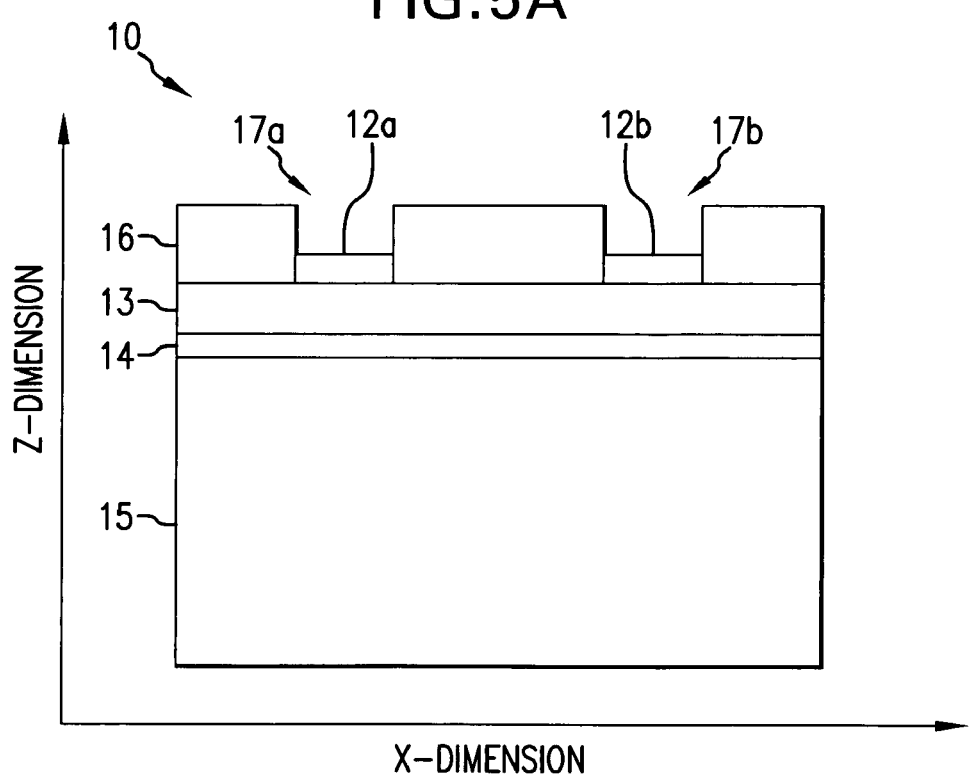
FIG. 5B is a cross-sectional side view showing the x- and z-dimensions in the x-, y-, z-coordinate system of the portion of the printed circuit board and trace of FIG. 5A after application of the solder mask but prior to application of solder paste.
Figure 5C:
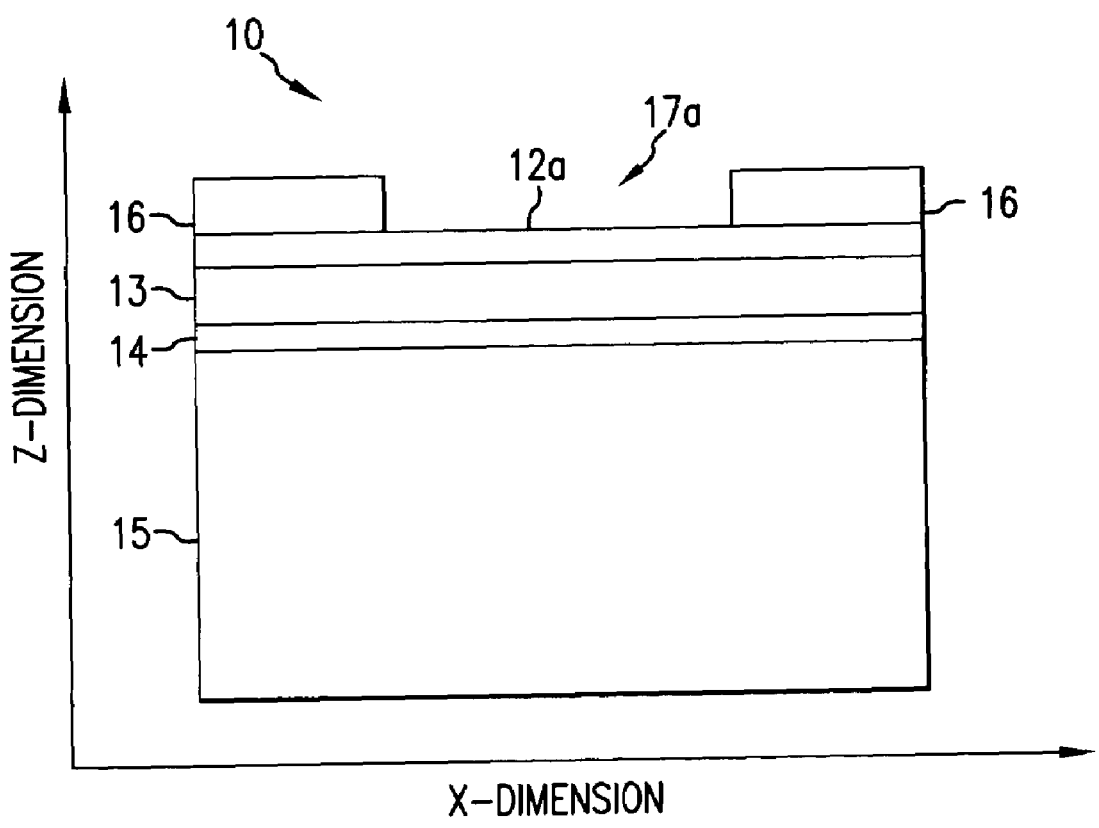
FIG. 5C is a cross-sectional side view showing the y- and z-dimensions in the x-, y-, z-coordinate system of the portion of the printed circuit board and trace of FIGS. 5A and 5B after application of the solder mask but prior to application of solder paste.
Figure 5D:
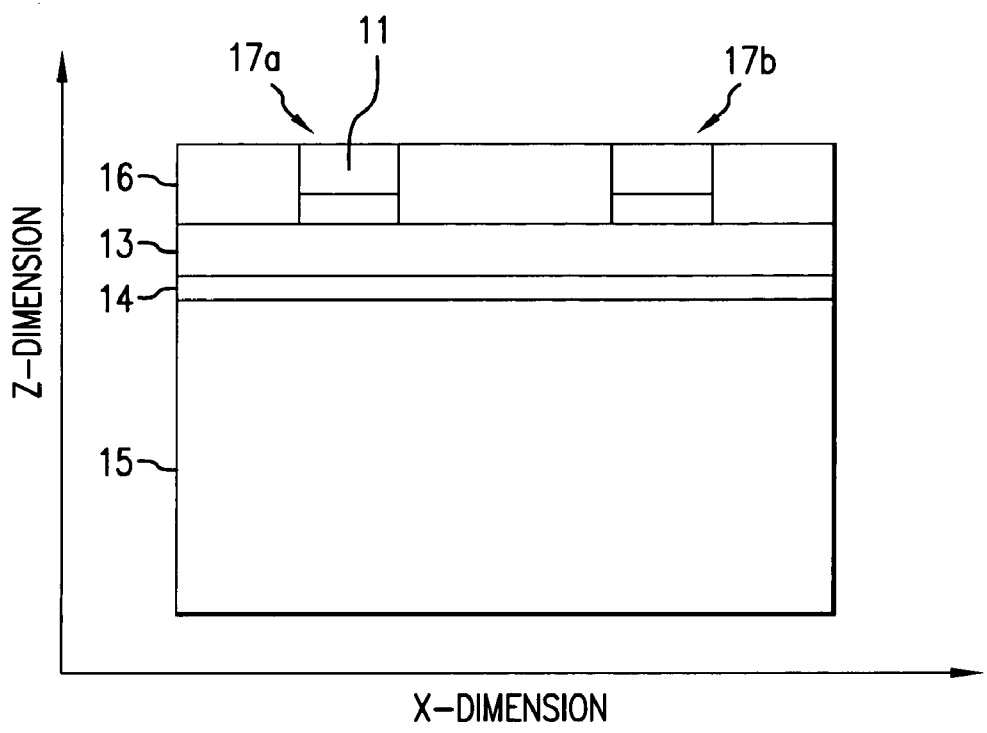
FIG. 5D is a cross-sectional side view showing the x- and z-dimensions in the x-, y-, z-coordinate system of the portion of the printed circuit board and trace of FIGS. 5A–5C after application of solder paste.
Figure 5E:
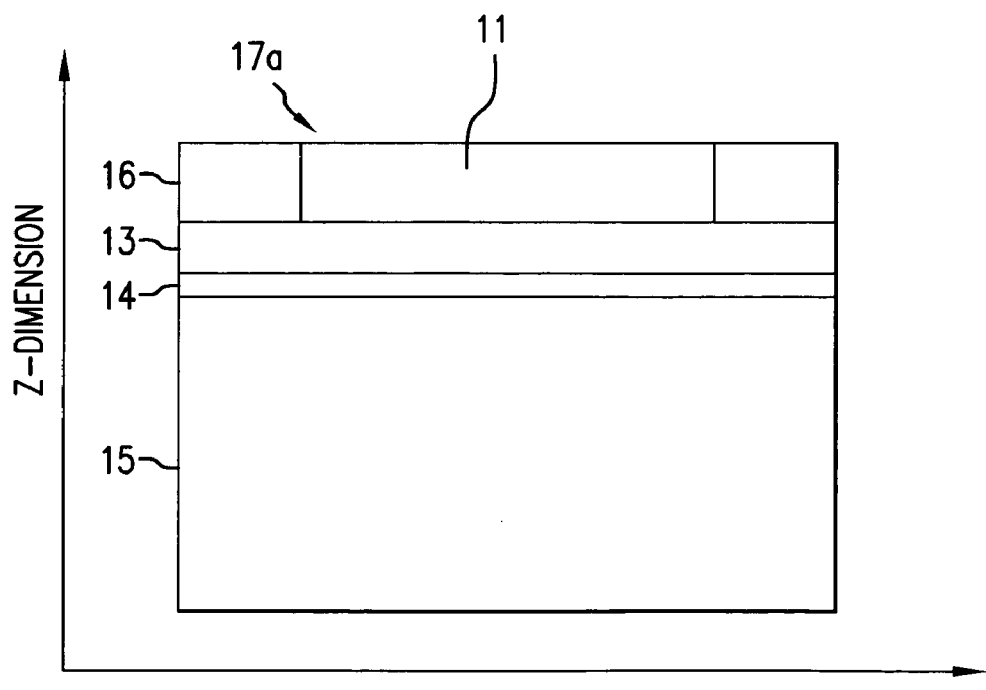
FIG. 5E is a cross-sectional side view showing the y- and z-dimensions in the x-, y-, z-coordinate system of the portion of the printed circuit board and trace of FIGS. 5A–5D after application of solder paste.

Once the test access point holes $17a$, $17b$ are located and the solder mask 16 is produced, printed circuit board fabrication proceeds as is normal in the art. To this end, in step 205, solder paste 11 is applied to the board 10, thereby filling the solder mask holes 17a, 17b, using the standard well-known silk-screen process, as illustrated in hole 17a in FIGS. 5D and 5E. Some solder paste may be applied to the solder mask 16 on either side of the signal trace 12. The area of the hole 17a determines the volume of solder paste 11 that ends up in the hole 17a. In step 206, the solder stencil 30 is removed leaving bricks or islands 11 of solder paste, as shown in FIGS. 5D and 5E.

Figure 5F:
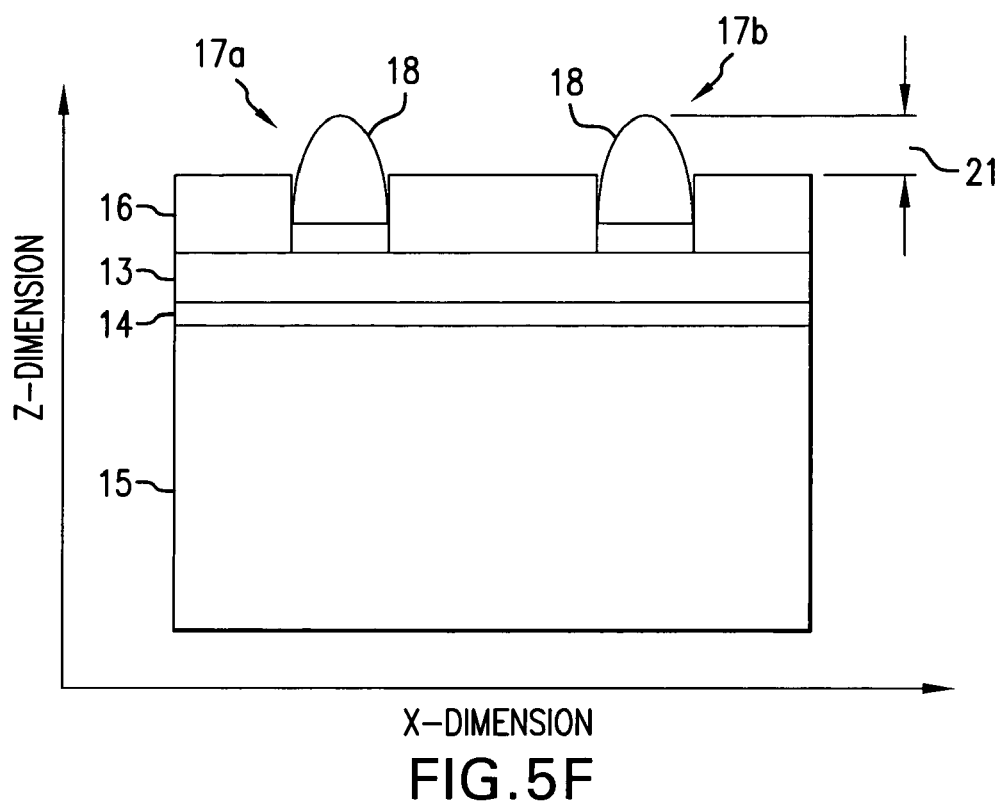
FIG. 5F is a cross-sectional side view showing the x- and z-dimensions in the x-, y-, z-coordinate system of the portion of the printed circuit board and trace of FIGS. 5A–5E after soldering.
Figure 5G:
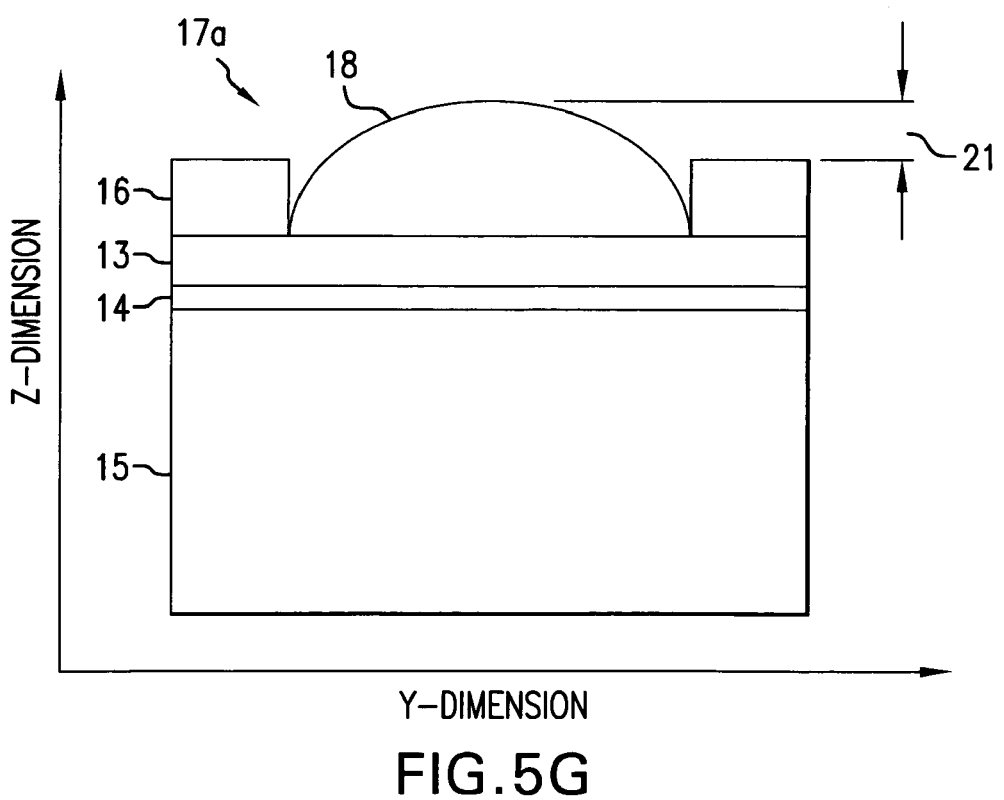
FIG. 5G is a cross-sectional side view showing the y- and z-dimensions in the x-, y-, z-coordinate system of the portion of the printed circuit board and trace of FIGS. 5A–5F after soldering.
Figure 6A:
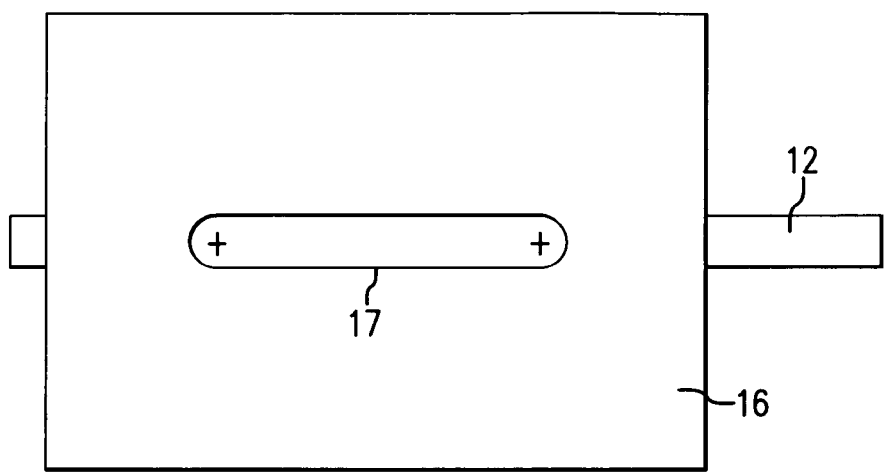
FIG. 6A is a top view of a portion of a printed circuit board showing a solder mask over a trace according to a method of the invention.
Figure 6B:
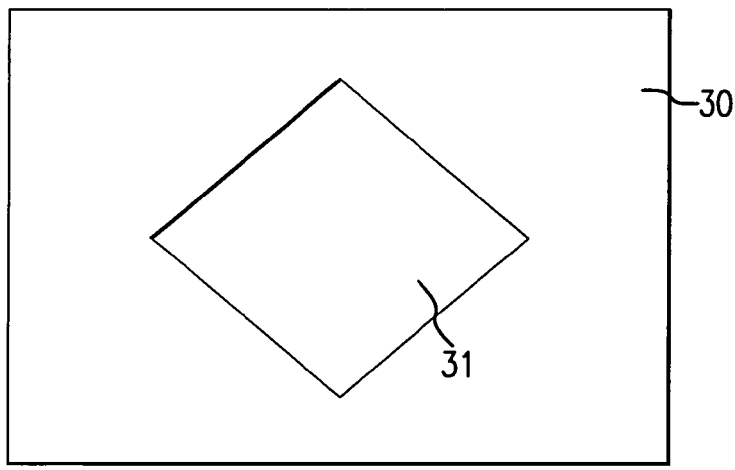
FIG. 6B is a top view of a portion of a solder stencil mask in accordance with a method of the invention.
Figure 6C:
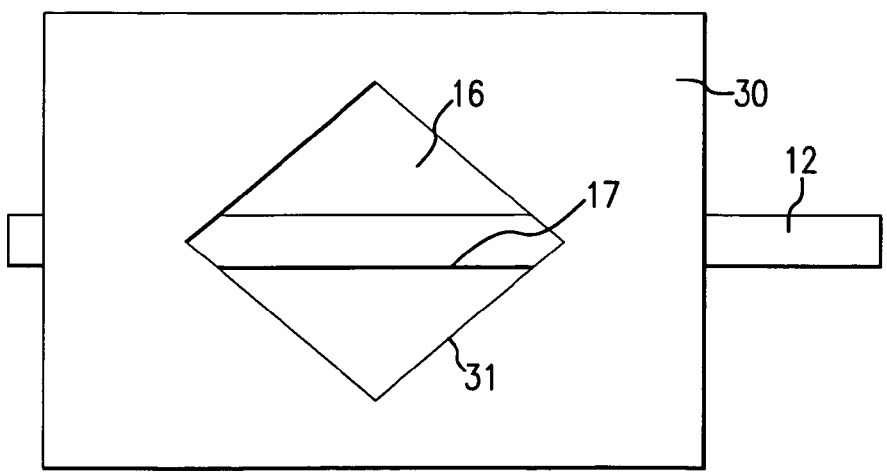
FIG. 6C is a top view of a portion of a printed circuit board showing a solder stencil mask over laying a solder mask over laying a trace on a printed circuit board in accordance with the invention.

In step 207, the solder paste is soldered to the conductive areas exposed by the solder mask, for example using a reflow soldering technique. Soldering is a very well-understood process. As known in the art, the solder paste is approximately 50% metal and 50% flux by volume. When the solder paste melts during reflow soldering, the flux burns off, preventing oxidation of the solder and reducing the end volume. Surface tension causes the paste to reform from a rectilinear shape, as defined by the stencil hole, into a semi-ellipsoidal shape defined by the exposed copper. Thus, the melted solder will retract from the walls 20 of the test access point hole 17a in the solder mask 16 and from the surface of the solder mask 16 and form a bead 18, as illustrated in FIGS. 5F and 5G that can project some distance 21 above the solder mask 16. This distance, or test access point structure thickness 21 in the z-dimension of the x-, y-, z-coordinate system, is determined by the area of the exposed trace 12a, 12b and the original volume of the solder paste 11. The square pattern of the solder stencil holes will allow solder paste to more reliably stick to the board during stenciling, and not peel up when the solder stencil 30 is removed from the board. Length D should preferably not be smaller than the value that can reliably deposit solder on the board.

The dimensions of the solder mask and stencil mask holes may be used to calculate the bead 18 height and length. The height of the resulting bead 18 may be determined by the area of the solder mask obround hole 17 and the volume of the solder paste applied to the board or the pre-reflow solder paste. The area of the obround hole 17 in the solder mask 16 is: Area=$W*L+\pi*(W/2)^2$. The pre-reflow solder paste volume is the area of the solder stencil hole 31 multiplied by the stencil thickness T. That is the pre-reflow solder paste volume=$T*D^2$. Since solder paste, by volume, is approximately 50% flux, about 50% of the paste volume will be left as a solder bead 18 after the reflow process step. That is, the post-reflow solder bead 18 volume=$T*D^2/2$. The height H of the bead 18 may be such that the resultant bead 18, standing on the underlying signal trace 12, will protrude above the solder mask 16 by 2 to 3 thousandths of an inch. The height H of bead 18 is approximately the post-reflow solder volume divided by the solder mask opening area or:

$$H=(T*D^2/2)/(W*L+\pi*(W/2)^2)$$

Given stencil thickness T, stencil hole diameter D, solder mask opening width W, and bead height H, than bead length L is approximately:

$$L=((T*D^2/2)/(H*W))-\pi*W/4$$

Figure 8:
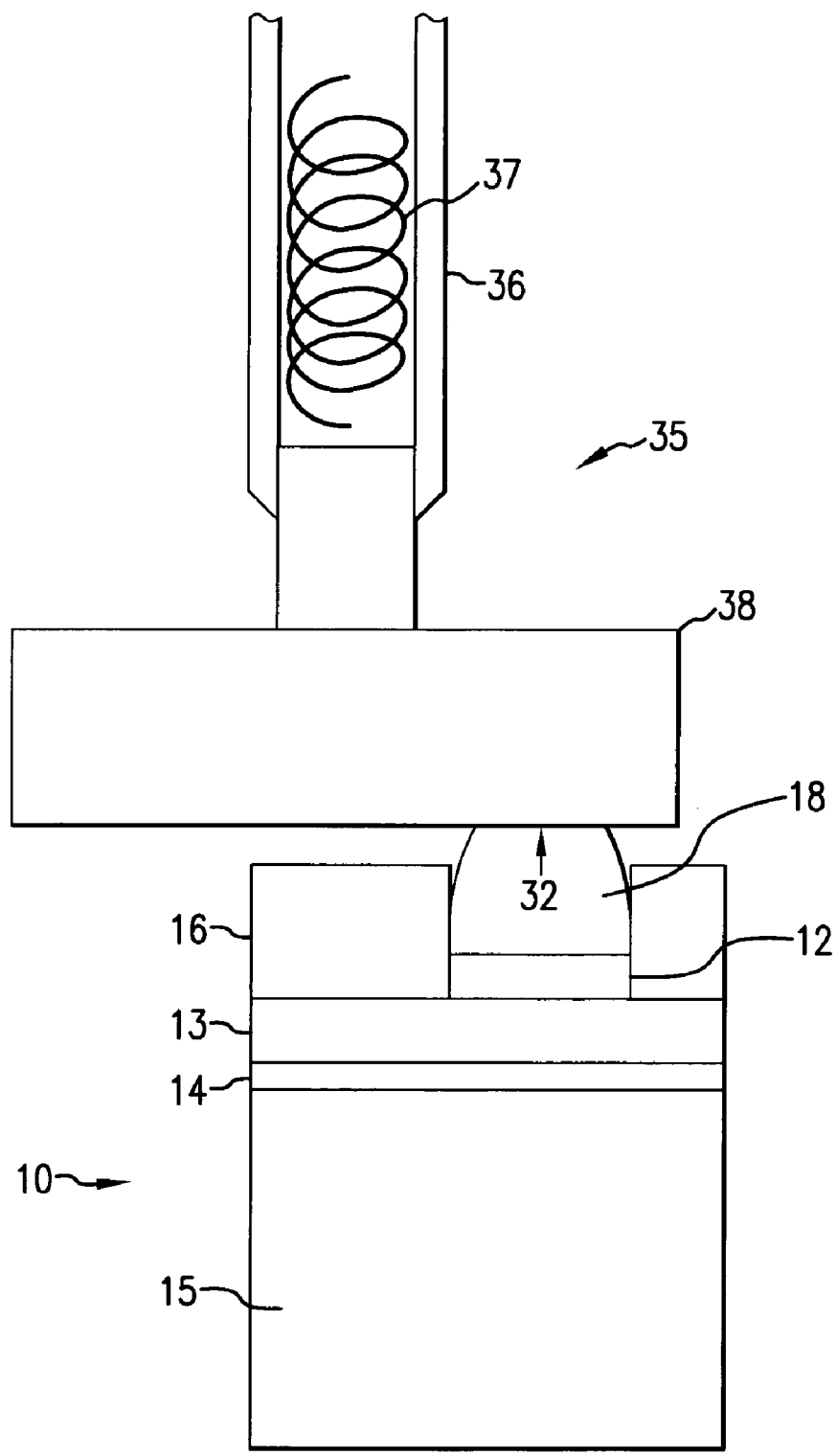
FIG. 8 is a side cross-sectional side view showing a portion of a printed circuit board with a test access point structure on a trace of a printed circuit board and a fixture probe contacting the test access point structure in accordance with the invention.
Figure 9:
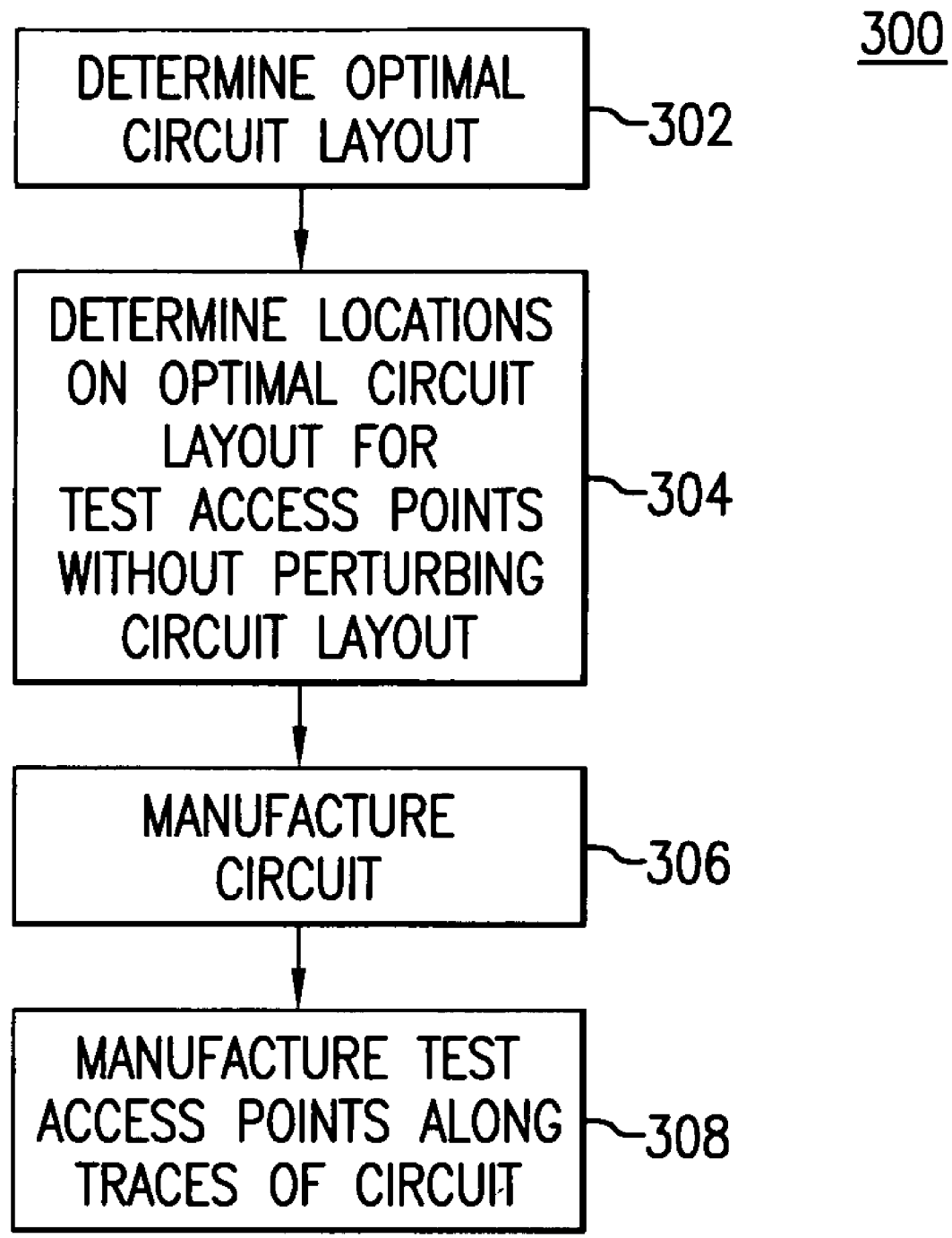
FIG. 9 is an operational flow chart illustrating a method of testing a test access point structure on a trace of a printed circuit board in accordance with the invention.

An important factor to probing a bead probe or test access point is its electrical contact resistance with the fixture probe contacting it, as shown in FIG. 8. Bead probes may have or develop surface contaminants, residues or oxides on the outer surface that may degrade or raise the contact impedance. One exemplary method to overcome this contact impedance problem due to surface residues, is to deform the bead probe with the fixture probe.

FIG. 8 illustrates a test access point 18 with a deformed upper surface 32 after a fixture probe 35 has contacted the test access point 18 with a predetermined force, such as a spring force 37 within a shaft 36 onto a flat head 38.

For the purposes of discussion, assume the fixture probe has a flat surface that comes in contact with the test access point or bead 18. If the radius of curvature is tight enough, the test access point structure 18 made of solder is subject to deformation when a fixture probe contacts it with a predetermined amount of force. A typical fixture probe force is approximately 4–8 ounces. The yield strength of typical solders (both leaded and lead-free) is approximately 5000 psi. Thus, when a fixture probe compressively contacts a newly formed bead or test access point 18 for the first time, the test access point 18 will deform with a substantially flattened top. The flat area 32 grows as the solder deforms, until the flat area 32 is great enough to support the fixture probe force. The process of deforming the bead or test access point 18 displaces any surface oxides, contaminants or residues and gives the fixture probe excellent electrical contact to the solder of the test access point 18.

By way of analogy, one can think of a potato as a bead probe and the potato skin as surface contaminants, residues or oxides. The potato is placed on a flat, hard surface. A second object, representing a fixture probe, having a flat, hard surface with a diameter at least as large as that of the potato is brought into compressive contact with the potato until the surface of the potato begins to deform and flatten. As this happens, the potato skin will be deformed and the flat surface of the second object, representing the fixture probe will come into contact with the inside of the potato, representing uncontaminated solder of the bead probe.

As an exemplary model, the yield strength of solder is approximately 5000 psi or 0.005 pounds per square mil, or 0.08 ounces per square mil. Thus, to support a typical 4 ounce flat probe, the flattened area 32 of the test access point 18 must be 4/0.08 or 50 square mils. Assume a 5 mil wide by 20 mil long bead 18 that is approximately 3 mils high. Assume that when the fixture probe first touches the bead 18, there is no flattened surface area. Then as the fixture probe pushes down on the solder, the area that is flattened 32 approximates an ellipse with a 1:4 width/length ratio. As this area increases, the solder yield begins to slow until there is a "footprint" of 50 square mils, or about ½ the total area of the bead itself. Once the surface area is large enough to support the fixture probe force, no further deformation occurs. Subsequent probing does not produce any further deformation.

A bead 18 that is too small will flatten until the point where the deformation is catastrophic, causing the bead to "mushroom" out and flatten onto the solder mask. Parts of it may break off as a result. If on the other hand, a bead 18 is too big, the amount of deformation will be small and the surface contaminants may not be displaced enough to give good electrical contact. Thus, the size of the bead 18 with respect to the expected probing force is an important design parameter. The inventor's have determined that the amount of deformation suggested in the above example and the manufacturing method described below give excellent results for test access point (bead) 18 longevity and contact resistance.

FIG. 8 illustrates a side cross-sectional view of a fixture probe contacting a test point access structure in accordance with the invention. As shown in FIG. 8, a printed circuit board 10 comprises a substrate 15, a ground plane 14, and at least one dielectric layer 13 with at least one trace 12 printed, deposited or otherwise attached thereon. A solder mask 16 with a hole 17 formed over the trace 12 at a location where a test access point structure 18 is positioned over the exposed surfaces of the dielectric layer 13 and trace layer 12. Test access point structure 18 is conductively attached to trace 12 within the solder mask hole 17 at the test access point. The test access point structure 18 projects above the exposed surrounding surfaces of the solder mask 16 to form an exposed localized high point on the trace 12 that may be electrically contacted as a test target by a fixture probe 35 during testing of the printed circuit board 10. As discussed above and shown in FIG. 8, as the fixture probe 35 is brought into initial compressive contact with test access point structure 18, test access point structure will be deformed and form a substantially flat upper surface 32, which will move any potential surface oxide, residues or contaminates and permit a good electrical contact between the fixture probe 35 and the test access point structure 18. Current trace widths are typically 3–5 mils wide, but may be as wide as 20 mils wide. Test access point structures or bead probe structures 18 may be approximately 3–5 mils wide by 15–20 mils long and may project 1–3 mils above the exposed surface of the printed circuit board.

Fixture probe 35 may be any known fixture probe with a substantially flat or smooth surface, such as a standard 35 mil round head/flat-faced plated fixture probe. Current design for test guidelines for ICT (in circuit testers) require a minimum 30 mil diameter testpad probed by a chisel or spear tipped probe. State of the art ICT fixtures can reliably probe down to 23 mil diameter targets. Thus, the small test access point structures or bead structures 18 may be probed with any industry standard probes with optimally approximately 23–35 mil diameter flat head.

While a waffle or other patterned surface fixture probe is possible to use, a flat surfaced fixture probe is considered better, as the aforementioned surface deformation provides excellent electrical contact results and overcomes certain drawbacks of a waffle surfaced fixture probe. For example, a substantially flat surfaced fixture probe will not dig into the surface and should therefore not damage the bead 18 on successive probing. Also, a waffle-patterned surface fixture probe will collect contaminants more easily and at the same time will be harder to clean. Also, the sharp points of a waffle patterned fixture probe may wear out as many boards are tested. A relatively smooth or flat surfaced avoids these drawbacks of a waffle or patterned surface fixture probe.

It will be appreciated from the above detailed description of the invention that the present invention uniquely solves the conflict problems faced by traditional techniques for test access point placement on printed circuit boards. In particular, in the prior art paradigm, test access points are treated as "targets" on a printed circuit board that are hit by probes. In the new paradigm as presented herein, the probes are integrated into the printed circuit board itself using solder beads or increased trace thickness, and the fixture probes are treated as the targets. Since in the invention the perturbations of traces in the x- and y-dimensions are minimized, and the z-dimension of the trace is utilized to implement test access points, test access points may be placed almost anywhere along the trace. This allows the placement decision of the test access points on the board to be made according to the locations of the fixture probes of a given test fixture rather than vice versa as done in the prior art.

Although this preferred embodiment of the present invention has been disclosed for illustrative purposes, those skilled in the art will appreciate that various modifications, additions and substitutions are possible, without departing from the scope and spirit of the invention as disclosed in the accompanying claims. For example, the test access targets may be deformed by some means other than by contact with the fixture probes. Also, bead probes may be implemented on either or both sides of a two-sided printed circuit board. It is also possible that other benefits or uses of the currently disclosed invention will become apparent over time.

What is claimed is:

1. A method for implementing a test access point structure for a printed circuit board, the method comprising:
   designing an optimal circuit board layout with at least one trace on an outer surface of the optimal circuit board layout;
   determining a location along said trace for a test access point without disturbing the optimal circuit board layout;
   manufacturing the optimal circuit board layout; and
   conductively connecting the test access point to the trace without disturbing the optimal circuit board layout, the test access point comprising a deformable localized high point of solder along the trace of the printed circuit board and substantially the same width as the trace, the test access point projecting above an exposed surface of the printed circuit board to be accessible for probing by a test probe with a substantially flat contact tip.

2. The method according to claim 1, wherein the step of conductively connecting said test access point to the trace comprises:
   depositing a solder mask over the trace, the solder mask having a hole exposing a portion of the trace and running along an upper surface of the trace at a location for a test access point, the solder mask characterized by a substantially constant thickness;
   placing a solder stencil mask over the solder mask, wherein the solder stencil mask has a hole slightly larger than the solder mask hole; and
   conductively connecting a test access point structure to the exposed portion of the trace in the hole in the solder stencil over the hole in the solder mask.

3. A method in accordance with claim 2, wherein the hole in the solder mask is substantially an obround hole.

4. A method in accordance with claim 2, wherein:
   the method of conductively connecting a test access point structure to the exposed portion of the trace in the hole of the solder mask comprises:
   filling the hole in the solder stencil over the hole in the solder mask with solder paste, the solder paste comprising solder and flux; and
   melting the solder paste to burn off the flux and to cause the solder to retract and form a solder bead that projects above the walls of the hole in the solder mask.

5. A method in accordance with claim 4, wherein the hole in the solder stencil mask is substantially a square.

6. A method in accordance with claim 5, wherein the substantially square hole in the solder stencil mask is layered over the substantially obround hole in the solder mask such that a diagonal of the substantially square hole runs along a length of the obround hole.

7. A method for implementing a test access point structure for a printed circuit board with an optimal circuit layout, the method comprising:
   determining a location of a test access point along a trace of the printed circuit board having one or more printed circuit board layers with a predetermined thickness over the trace without disturbing the optimal circuit layout on the printed circuit board;
   forming a hole in the one or more printed circuit board layers over the location of a test access point along the trace, exposing a portion of the trace; and
   forming a deformable test access point structure electrically connected to the exposed portion of the trace, the deformable test access point structure comprising a localized high point of solder along the trace, substantially the same width as the trace, the deformable test access point structure being higher than a top surface of the printed circuit board enabling the deformable test access point structure to be probed by a probe having a substantially flat contact tip that is substantially wider than the deformable test access point structure.

8. The method of claim 7, wherein the one or more printed circuit layers comprises a solder mask layer.

9. The method of claim 8, wherein the hole in said one or more printed circuit board layers comprises an obround hole running along and exposing a portion of the trace thereunder.

10. The method of claim 9, wherein the step of forming a test access point structure electrically connected to the exposed portion of the trace comprises:

filling the hole in the solder mask with solder paste, and heating the solder paste causeing the solder to retract and form a deformable test access point that projects above top surface of the printed circuit board enabling the deformable test access point to be probed by a probe having a substantially flat contact tip that is substantially wider than the deformable test access point structure.

* * * * *

UNITED STATES PATENT AND TRADEMARK OFFICE
CERTIFICATE OF CORRECTION

PATENT NO. : 7,190,157 B2 Page 1 of 1
APPLICATION NO. : 10/972822
DATED : March 13, 2007
INVENTOR(S) : Parker It is certified that error appears in the above-identified patent and that said Letters Patent is hereby corrected as shown below:

In column 12, line 5, in Claim 10, delete "causeing" insert -- causing --, therefor.

Signed and Sealed this

Twenty-sixth Day of June, 2007

JON W. DUDAS
*Director of the United States Patent and Trademark Office*